(12) United States Patent
Maekawa

(10) Patent No.: US 7,592,249 B2
(45) Date of Patent: Sep. 22, 2009

(54) METHOD FOR MANUFACTURING A SEMICONDUCTOR DEVICE

(75) Inventor: Atsushi Maekawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 21 days.

(21) Appl. No.: 12/037,118

(22) Filed: Feb. 26, 2008

(65) Prior Publication Data

US 2008/0299760 A1 Dec. 4, 2008

(30) Foreign Application Priority Data

Feb. 28, 2007 (JP) .............................. 2007-048515

(51) Int. Cl.
 *H01L 21/4763* (2006.01)
(52) U.S. Cl. ................. 438/623; 438/725; 257/E21.575
(58) Field of Classification Search ................. 257/759, 257/E21.575, E21.254, 296, 300, 306, 308, 257/900, E21.577–578, E21.58, E21.585; 438/562, 623, 725, 780, 253, 254, 256, 397, 438/595
See application file for complete search history.

(56) References Cited

U.S. PATENT DOCUMENTS

| 6,573,551 | B1 | 6/2003 | Kim et al. | |
|---|---|---|---|---|
| 6,878,637 | B2 | 4/2005 | Lee | |
| 2006/0281298 | A1* | 12/2006 | Noguchi et al. | ............. 438/622 |

FOREIGN PATENT DOCUMENTS

| JP | 4-030450 | 2/1992 |
|---|---|---|
| JP | 11-87493 | 3/1999 |
| JP | 2001102550 | 4/2001 |
| JP | 2003197775 | 7/2003 |
| JP | 2006-108452 | 4/2006 |

OTHER PUBLICATIONS

Japanese Patent Office issued a Japanese Office Action dated Mar. 17, 2009, Application No. 2007-048515.

* cited by examiner

*Primary Examiner*—Davienne Monbleau
*Assistant Examiner*—Shweta Mulcare
(74) *Attorney, Agent, or Firm*—Young & Thompson

(57) ABSTRACT

A highly reliable method for forming contact plugs is provided. The method can prevent short circuiting from occurring between self aligned contact plugs and word lines or between self aligned contact plugs and bit lines by applying a material, whose etching speed ratio relative to that of the silicon-based insulating film is 100 or more, to an interlayer film for forming the contact plugs therein. The method comprises forming wiring lines each of which is covered with silicon oxide films at its top surface and lateral sides, forming a sacrificial interlayer film overall, which is made up of an organic coating film without containing silicon, so as to cover the wiring lines, forming contact holes by sequentially etching the sacrificial interlayer film and a lower-layer insulating film, and forming contact plugs. The method further comprises forming columns of the contact plugs by removing the sacrificial interlayer film, forming an interlayer insulating film overall, and partially removing the interlayer insulating film from above the surface thereof to expose the surfaces of the capacitor contact plugs.

11 Claims, 12 Drawing Sheets

METHOD FOR MANUFACTURING A SEMICONDUCTOR DEVICE

This application is based upon and claims the benefit of priority from Japanese Patent Application No. 2007-048515, filed on Feb. 28, 2007, the disclosure of which is incorporated herein in its entirety by reference.

BACKGROUND OF THE INVENTION

1. Field of the Invention

The present invention relates to a method for manufacturing a semiconductor device, and more particularly, to a method for manufacturing a DRAM (Dynamic Random Access Memory) in which a short-circuit margin between a fine contact hole formed by self alignment and an adjacent wiring line has been increased.

2. Description of the Related Art

It is a mainstream trend recently that a DRAM is imparted with a COB (Capacitor Over Bit-line) structure because of the feasibility in ensuring the capacity of the capacitors. In the COB structure, main components of the memory cells include word lines formed on a surface of a semiconductor substrate, bit lines arranged over the word lines through an interlayer insulating film so as to be perpendicular to the word lines, and capacitors formed above the bit lines through an interlayer insulating film. Each of the capacitors arranged uppermost is connected to the semiconductor substrate through contact plugs formed threading through gaps between the word lines and the bit lines, so as not to cause short circuiting with the lines.

An example of a structure of memory cells in a DRAM will further be described in detail with reference to a plan view of FIG. 1 and a cross-sectional view of FIG. 2.

As illustrated in the plan view of FIG. 1, active regions 101a each surrounded by element isolation regions 102 are regularly arranged to stand in rows. Word lines 105 are arranged to traverse plurality of active regions 101a, with each of word lines 105 being provided with a sidewall 105d at both sides thereof. The word lines constitute the gate electrodes of the transistors formed on active regions 101a. Bit lines 111 are arranged being substantially perpendicular to the word lines. Further, drains 103 and sources 104 are provided as diffusion layers for the transistors formed in the active regions. Contact plugs 107a and 108a are provided on each drain 103 and source 104, respectively, so as to be connected to upper wiring. Each contact plug 107a is connected to bit line 111 and each contact plug 108a is connected to a capacitor provided on an upper layer portion.

The cross-sectional view of FIG. 2 schematically illustrates a cross section taken along a line A-A of FIG. 1. Element isolation regions 102 as well as drains 103 and sources 104, each made up of an n-type diffusion layer, are provided in predetermined regions in a surface of p-type semiconductor substrate 101. The word lines each consisting of gate electrode 105b and protection insulating film 105c are provided through gate insulating film 105a formed on the surface of semiconductor substrate 101. Each of the word lines is provided with sidewalls 105d. First interlayer insulating film 106 is provided to cover the word lines. Contact holes 107 and 108 are provided in predetermined regions of first interlayer insulating film 106, while contact holes 107 and 108 are provided with contact plugs 107a and 108a, respectively. Second interlayer insulating film 109 is provided on the surfaces of contact plugs 107a and 108a and first interlayer insulating film 106. Bit line contact plugs 110 are provided so as to be connected to respective contact plugs 107a. Also, second contact plugs 110a each serving as a part of a capacitor contact plug are provided so as to be connected to respective contact plugs 108a. Bit lines 111 are provided on respective bit line contact plugs 110, while bit lines 111 are covered with third interlayer insulating film 112. Third interlayer insulating film 112 is provided with capacitor contact plugs 113 each of which is positioned between bit lines 111 and connected to second contact plug 110a. Fourth interlayer insulating film 114 is provided on the surfaces of capacitor contact plugs 113 and the third interlayer insulating film, while cylinder holes are formed in the fourth interlayer insulating film so as to be located at positions corresponding to respective capacitor contact plugs 113. Lower electrode 115 is provided at an inner surface of each cylinder hole so as to be connected to capacitor contact plug 113. Capacitor insulating film 116 and upper electrodes 117 are provided to cover lower electrodes 115. Further, wiring layer 119 is provided through fifth interlayer insulating film 118, whereby memory cells having the COB structure are constituted.

The memory cells in a DRAM having the COB structure as described above have been downsizing with the demand for enhancing its integration density. This also necessitates the reduction of a planar area allowed for each component, and thus formation of the contact plugs mentioned above has also become considerably difficult. In particular, formation of contact plugs 107a and 108a between adjacent word lines and formation of each capacitor contact plug 113 between bit lines 111 have been brought into a more difficult situation because of the reduced processing margins. In order to reduce such difficulties, SAC (Self Aligned Contact) processes have been used for forming contact holes.

However, even the use of the SAC processes has allowed the following problem to come up to the surface. Referring to cross-sectional views illustrated in FIGS. 3A and 3B, the problem is explained.

As shown in FIG. 3A, word lines, each consisting of gate electrode 105b and protection insulating film 105c made up of a silicon nitride film, are formed first, and sidewalls 105d, each made up of a silicon nitride film, are also formed. After that, first interlayer insulating film 106 made up of a silicon oxide film is formed overall, followed by forming hard mask layer 130. Then, using photolithography, photoresist pattern 131 is formed to transfer the hole pattern to hard mask layer 130 so that hard mask 130a is formed.

Subsequently, as shown in FIG. 3B, dry etching is carried out to etch first interlayer insulating film 106 made up of a silicon oxide film by using photoresist pattern 131 and hard mask 130a as a mask. In this case, since etching selection ratio cannot be sufficiently ensured between the silicon oxide film and the silicon nitride film, etching of the silicon oxide film down to the surface of the semiconductor substrate involves etching of the silicon nitride film at shoulder portions of each gate electrode 105b. As a result, the thickness of a portion in the insulating film indicated by a circle B is reduced, raising a problem of short circuiting between a contact plug, which will be formed subsequently, and the gate electrode. In dry etching, since a smaller diameter of a hole permits the speed of etching of the hole bottom to become relatively slower, this problem will become more serious as the memory cells are more miniaturized.

To avoid the problem explained above, Japanese Patent Laid-Open No. 2003-197775 (D1) suggests performing an SAC process using an organic film having low dielectric constant. According to a method disclosed in D1, gate electrodes each having a spacer at sidewalls thereof are formed first, followed by forming an organic film having low dielectric constant overall, the height of the organic film being substantially the same as that of each gate electrode, so that spaces between the gate electrodes are buried by the film. Then, an inorganic insulating film is stacked overall, followed by forming predetermined holes in the inorganic insulating film using lithography and dry etching. Then, using the inorganic insulating film as a mask, the organic film having low dielectric constant is dry etched using an etching gas whose main content is oxygen to thereby form contact holes.

D1 discloses various organic films having low dielectric constant. Material of each of the films is a carbon film formed by a CVD (Chemical Vapor Deposition) process or an organic coating film containing silicon or fluorine. The former, i.e., the carbon film formed by the CVD process, has a poor step-covering property and thus voids are formed in the film, which resultantly raises a problem of short circuiting between the contact holes through the voids. The latter, i.e., the organic coating film, has a poor heat resistance and thus may raise a problem of heat deformation of a pattern or degassing in manufacturing steps that require use of heat of 500° C. or more. D1 describes a side benefit of reducing parasite capacitance in the wiring by taking an approach of leaving the organic film having low dielectric constant as it is. In this case, however, heat load imposed during a step following the formation of the organic film having low dielectric constant, is required to be limited to 500° C. or less. Thus, application of this approach to a semiconductor device, such as a DRAM, is problematically difficult because of a later step of imposing heat load of about 700° C. In addition, although not specifically described in D1, if contact plugs are formed of tungsten in each of these organic coating films, there may be a problem that the organic coating film is etched by fluorine contained in a raw material of tungsten.

SUMMARY OF THE INVENTION

In light of the problems described above, the present invention has as its object to provide a method for manufacturing a semiconductor device which enables formation of fine contact plugs by preventing damages that would be caused by heat deformation or fluorine, even when contact holes are formed using an organic coating film and then contact plugs are formed using a gas whose material contains fluorine.

In order to achieve the object mentioned above, the method for manufacturing a semiconductor device in the present invention comprises in the following order: forming an organic coating film on a semiconductor substrate; forming contact holes in the organic coating film; forming a contact plug in each of the contact holes; selectively removing the organic coating film to expose at least a portion of sidewalls of each of the contact plugs; forming an inorganic insulating film overall to bury the contact plugs in the inorganic insulating film; and polishing a surface of the inorganic insulating film to expose surfaces of the contact plugs.

According to the method for manufacturing a semiconductor device of the present invention, the contact holes are formed in the organic coating film, followed by forming the contact plugs in the respective contact holes, and further followed by once removing the organic coating film to expose the contact plugs, and then spaces between adjacent contact plugs are buried again by an inorganic insulating film having no problem in heat resistance. Thus, fine contact plugs can be formed by preventing short circuiting from occurring between the contact plugs and gate electrodes. At the same time, even if a heat load of 500° C. or more is imposed in a later step, no problem that would be ascribed to heat deformation of the organic coating film is caused.

As the organic coating film mentioned above, the method for manufacturing semiconductor elements of the present invention uses an organic coating film without containing silicon. If an organic coating film containing silicon is subjected to plasma etching using only oxygen, the silicon may remain as a residue on the etched surface. In order to avoid this, it is required, as described in D1, to add a fluorine-containing gas to the oxygen that is a main etching gas. This however entails etching of members, such as a silicon nitride film, making it difficult to perform highly selective etching. In this regard, use of an organic coating film without containing silicon in the present invention can achieve removal of the organic coating film in an atmosphere without containing fluorine to thereby ensure etching selection ratio for a silicon-based insulating film such as a silicon oxide film and a silicon nitride film, for example, by a factor of 100 or more.

Further, in the method for manufacturing a semiconductor device of the present invention, forming the contact plugs at least comprises in the following order: forming a silicon film overall after forming contact holes in the organic coating film; forming a first metal film and a metal nitride film overall after forming the silicon film; forming a second metal film overall so as to bury the contact holes after forming the first metal film and the metal nitride film; and removing the silicon film, the first metal film and the metal nitride film, and the second metal film formed on the organic coating film.

For example, in the case where the second metal films mentioned above are each formed of a tungsten film, it is possible to perform a CVD process under the conditions where tungsten hexafluoride ($WF_6$) and hydrogen ($H_2$) are used as a material gas with the temperature being 400° C. Use of the temperature 400° C. can avoid the problem of heat deformation of the organic coating film. In this case, however, fluorine and hydrogen fluoride are produced as reaction by-products. The organic coating film may be etched by these reaction by-products to increase the surface roughness of the film, leading to possible inhibition in the formation of fine contact plugs. In this regard, in the present invention, the organic coating film is covered with a metal-nitride film, such as a titanium nitride film, before forming a tungsten film. Thus, the organic coating film can be prevented from being etched such as by fluorine, with the titanium nitride film serving as a barrier layer. Alternatively, a silicon film may be formed for use as a part of the barrier layer, before forming the metal-nitride film. The silicon film in this case can be formed by a CVD process using disilane ($Si_2H_6$) and diborane ($B_2H_6$) as a material gas. For generally used phosphor-doped silicon films, monosilane ($SiH_4$) or disilane and phosphine ($PH_3$) are used as a material gas. In this case, a temperature of at least 500° C. or more is required, which may be led to possible heat deformation of the organic coating film. However, in the case of forming a boron-doped silicon film using diborane, the catalytic phenomenon which is characteristic of a diborane material can allow formation of a film at a temperature of 350° C., thus raising no problem of causing heat deformation in the organic coating film.

According to the present invention, a method for manufacturing a semiconductor device can be provided, which enables formation of fine contact plugs, preventing damages that would be caused by heat deformation or fluorine, even when contact holes are formed in an organic coating film and then the contact plugs are formed using a gas containing fluorine as a material.

DETAILED DESCRIPTION OF THE PREFERRED EMBODIMENTS

With reference to FIGS. 4A to 6B, hereinafter will be described in detail exemplary embodiments of the present invention. For the sake of convenience of explanation, FIGS. 1 and 2 are used as required.

First Exemplary Embodiment

A first exemplary embodiment will be described first, referring to cross-sectional views of FIGS. 4A to 4H illustrating a series of steps. The first exemplary embodiment uses an organic coating film to form contact plugs therein adjacent to word lines.

Figure 1:
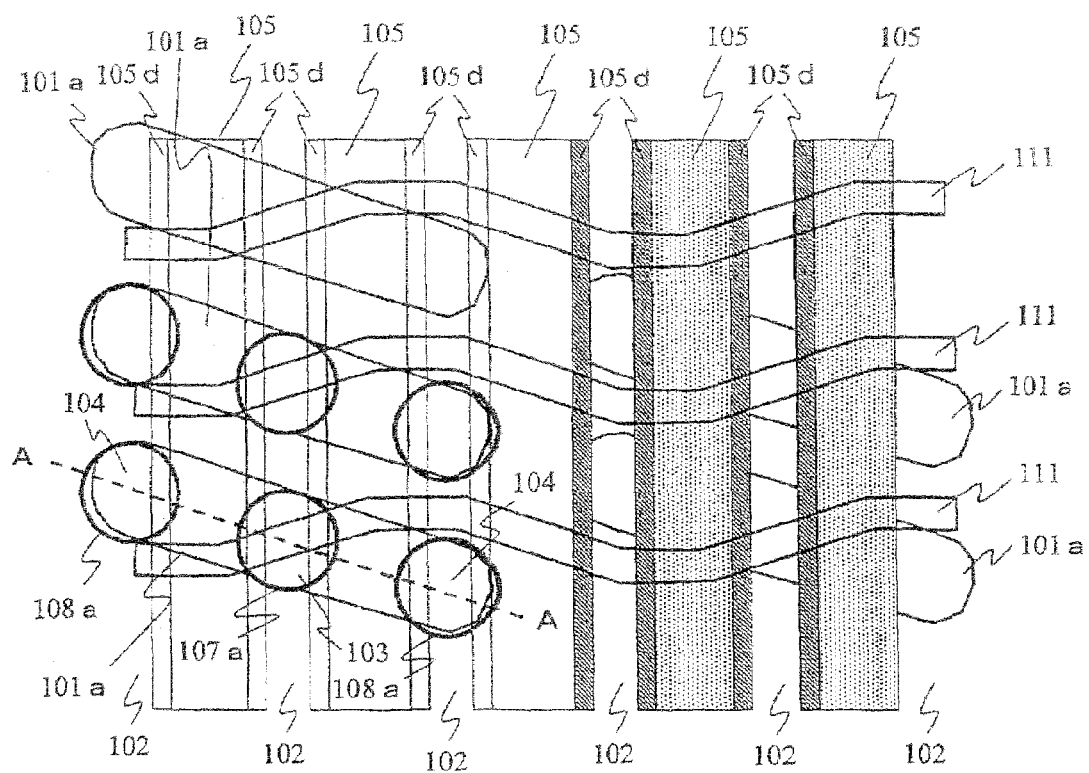
FIG. 1 is a plan layout for explaining one example of a DRAM cell.
Figure 2:
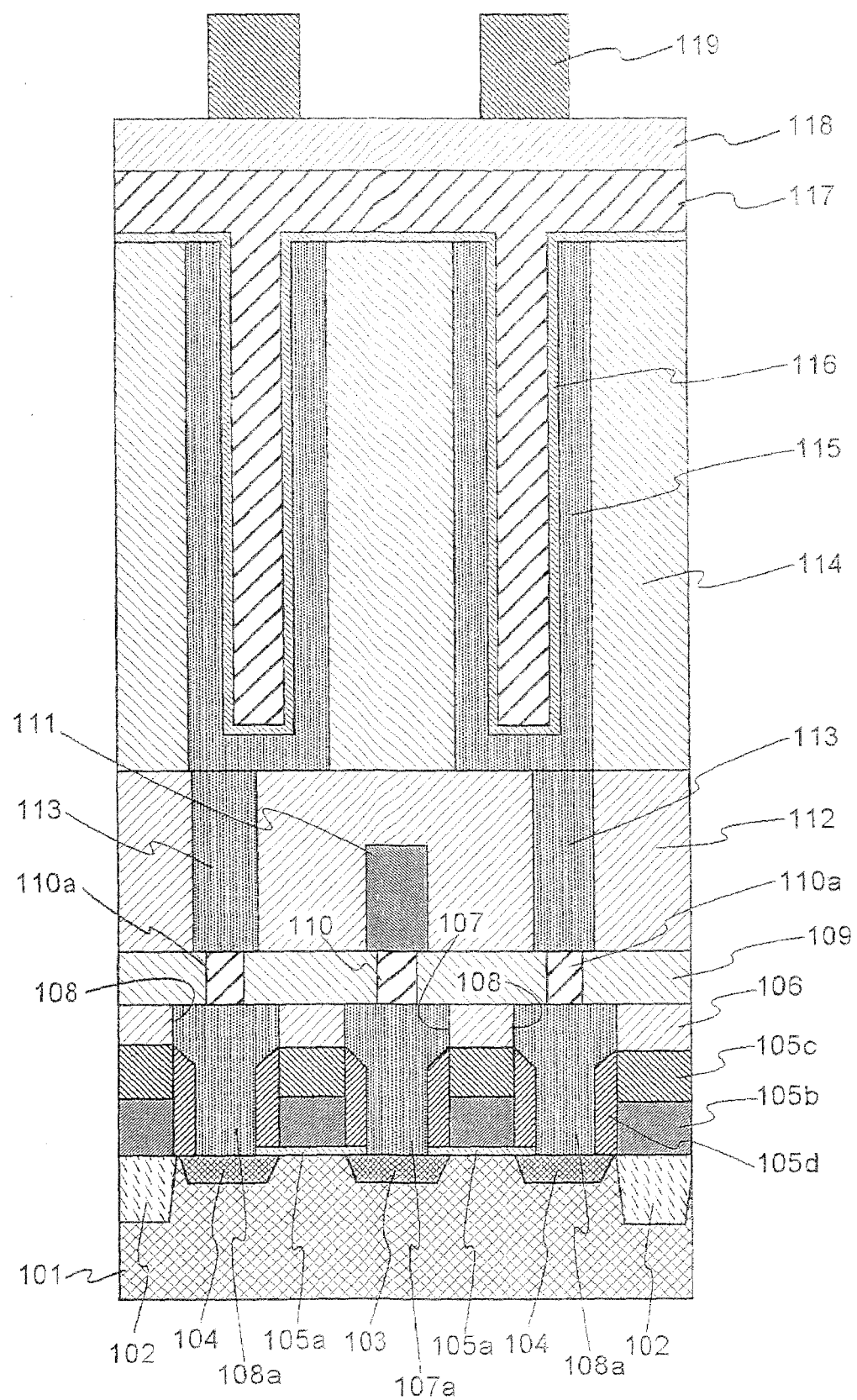
FIG. 2 is a cross-sectional view taken along a line A-A of FIG. 1, for explaining an example of a DRAM cell.
Figure 3A:
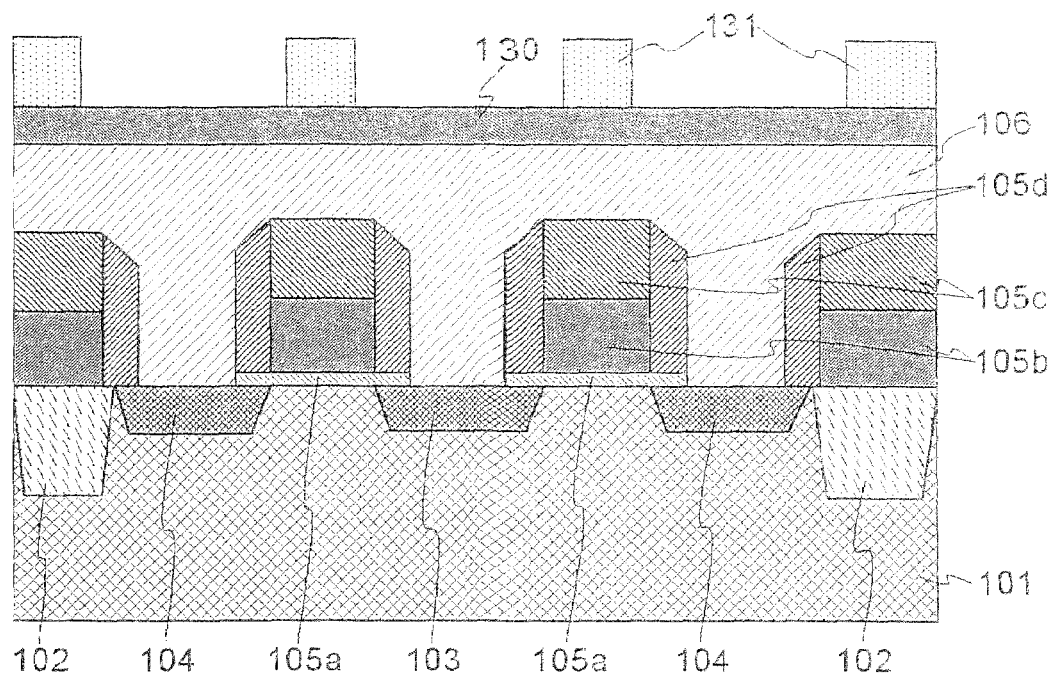
FIGS. 3A and 3B are cross-sectional views illustrating a series of steps, for explaining problems of related art.
Figure 3B:
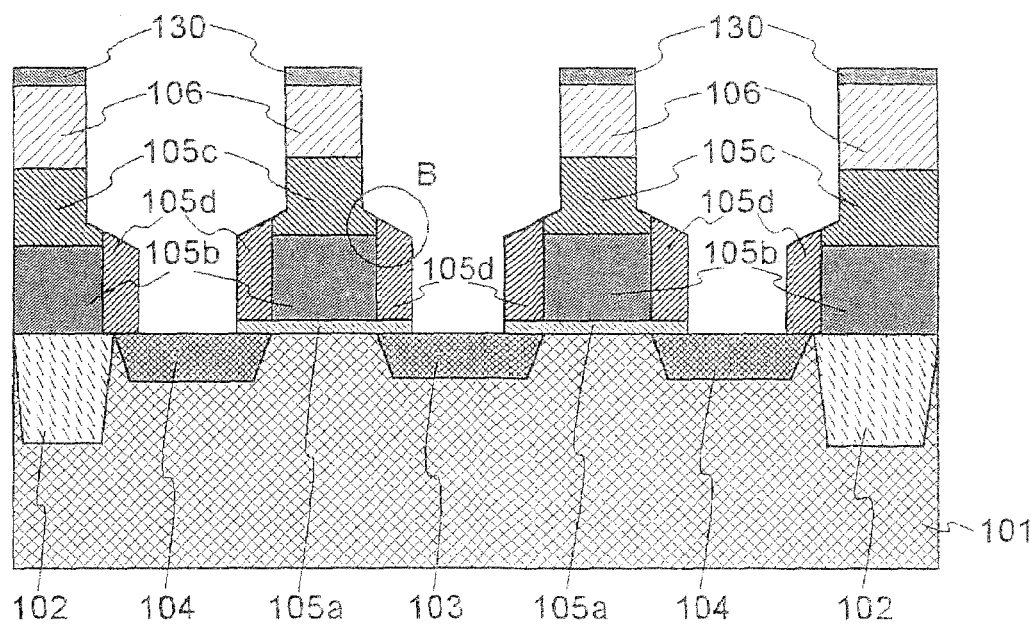
Figure 4A:
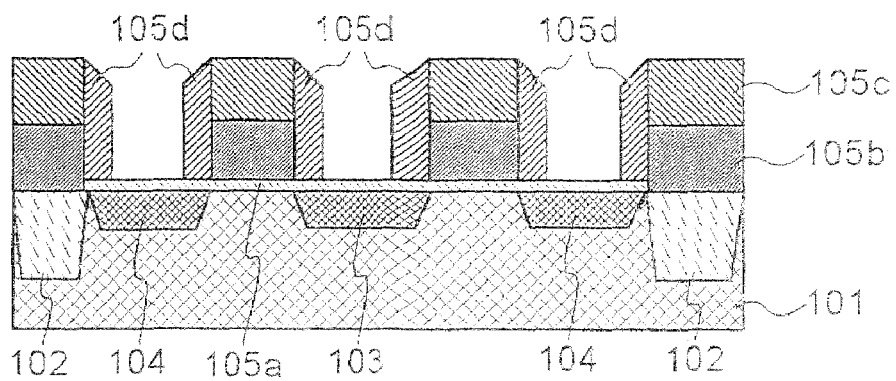
FIGS. 4A to 4H are cross-sectional views illustrating a series of steps, for explaining a first exemplary embodiment of the present invention.

As shown in FIG. 4A, element isolation regions 102 were formed first, using an STI (Shallow Trench Isolation) process, in the surface of semiconductor substrate 101 made of p-type silicon to form active regions 101a shown in FIG. 1. Then, gate insulating film 105a made up of a silicon oxide film of 6 nm thick was formed on the surface of each active region using a thermal oxidation process. Also, gate electrode 105b of 140 nm thick and protection insulating film 105c made up of a silicon nitride film of 140 nm thick were formed overall. Gate electrode 105b were formed, from bottom up, of a phosphor-doped silicon film and a tungsten silicide film both formed by a CVD process, and a stacked film consisting of a tungsten nitride film and a tungsten film both formed by sputtering. After that, protection insulating film 105c and gate electrode 105b were processed using lithography and dry etching. In these processes, the tungsten film and the tungsten nitride film were etched using protection insulating film 105c as a mask, followed by temporarily covering exposed sidewalls of the tungsten film and the tungsten nitride film with a silicon nitride film of about 10 nm thick. Then, the base films, i.e. the tungsten silicide film and the phosphor-doped silicon film were etched. After that, the resultant was thermally oxidized using a selective oxidation process, so that an oxide film on the surface areas of the silicon substrate and between the gate electrodes would have a thickness of 15 nm. Gate electrode 105b and protection insulating film 105c processed in this way constitute word lines 105 shown in FIG. 1.

Subsequently, a silicon nitride film of 20 nm thick was formed overall using a CVD process, which film was then etched back using dry etching to form sidewall 105d on both sides of each word line 105. After forming word lines 105 and sidewalls 105d, impurities were implanted in each surface of the active region by ion implantation to form a diffusion layer that would serve as drain 103 and sources 104.

Figure 4B:
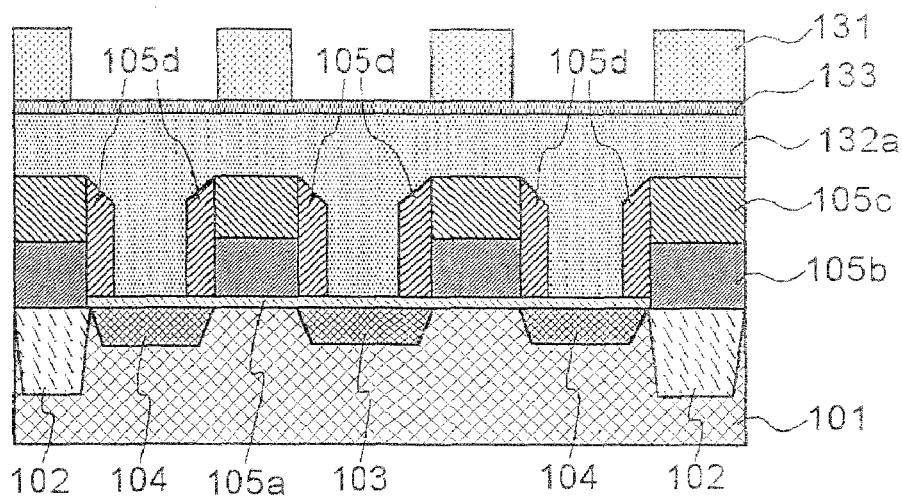

Then, as shown in FIG. 4B, organic coating film 132a of 400 nm thick was formed overall by spin coating. As organic coating film 132a, one which does not contain silicon, for example "SiLK" which is a trade name of a polymer dielectric material manufactured by Dow Chemical Company, was used. The coated organic coating film 132a was then baked at a temperature of 425° C. Subsequently, hard mask layer 133 made up of a silicon oxide film of 15 nm was formed overall using a CVD process. The resultant was then subjected to lithography to form a hole pattern formed of photoresist 131.

Figure 4C:
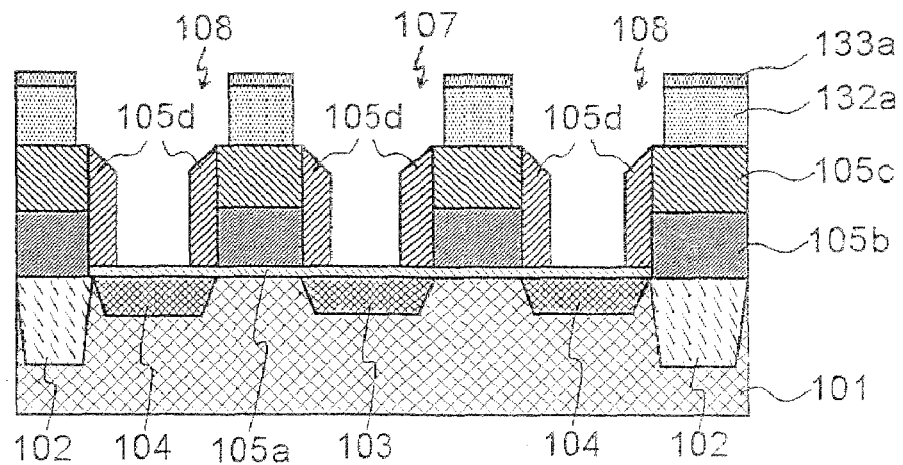

Then, as shown in FIG. 4C, hard mask layer 133 was etched using gas plasma of tetrafluorocarbon ($CF_4$) and using photoresist 131 as a mask to form hard mask 133a. Further, organic coating film 132a was subjected to anisotropic dry etching with ammonia plasma by using hard mask 133a and photoresist 131 as a mask. The anisotropic dry etching was carried out using a plasma etching apparatus of parallel plate electrodes type, under the conditions of 13.56 MHz, high-frequency power of 1000 W and pressure of 100 mTorr (13 Pa). This etching, which uses plasma that does not contain fluorine or chlorine, can ensure an etching selection ratio for the silicon nitride film or the silicon oxide film by a factor of 100 or more. Oxygen plasma may be used for the anisotropic dry etching. Accordingly, the silicon nitride film or the silicon oxide film remains without being substantially etched. It should be appreciated that in carrying out the anisotropic etching, photoresist 131 is concurrently etched and eliminated. As a result, contact holes 107 and 108 are formed.

Figure 4D:
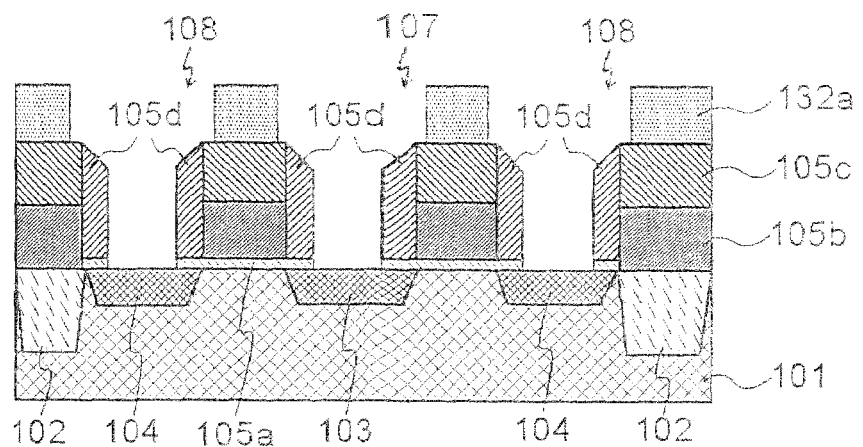

Then, as shown in FIG. 4D, the silicon oxide film exposed in the surface areas of the semiconductor substrate, which serve as bottom surfaces of contact holes 107 and 108, was removed by dry etching. Since the silicon oxide film is as thin as 15 nm, etching can be performed without damaging the entire shape. Mixed gas plasma of octafluorocyclobutane ($C_4F_8$) with oxygen and argon can be used for the etching of the silicon oxide film. It should be appreciated that in carrying out the dry etching, hard mask 133a is concurrently etched and eliminated.

Figure 4E:
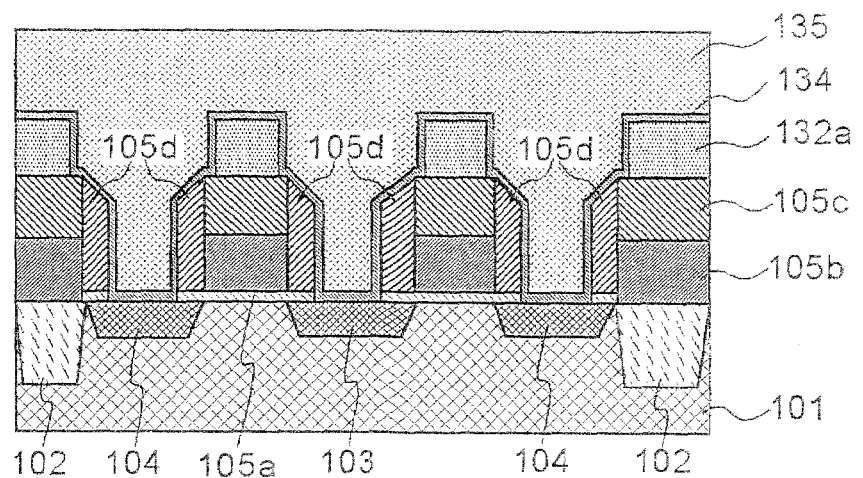

Then, as shown in FIG. 4E, the exposed surface areas of the semiconductor substrate were washed and then barrier layer 134 was formed, followed by further forming tungsten film 135 to bury contact holes 107 and 108. Barrier layer 134 was formed of a silicon film, titanium film and titanium nitride film. Details of forming barrier layer 134 will be described later. Tungsten film 135 was formed by a CVD process at a temperature of 400° C. using a material gas of tungsten hexafluoride ($WF_6$) and hydrogen. In this case, although fluorine is produced by the decomposition of $WF_6$, no etching is caused by this fluorine because organic coating film 132a is covered with barrier layer 134.

Figure 4F:
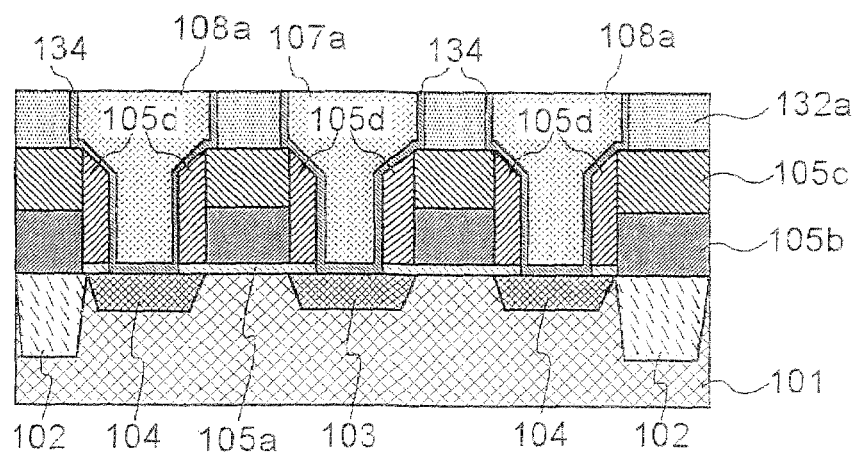

Then, as shown in FIG. 4F, tungsten film 135 and barrier layer 134 formed on organic coating film 132a were etched back to form contact plugs 107a and 108a in contact holes 107 and 108, respectively. At the same time, the surface areas of organic coating film 132a were exposed.

Figure 4G:
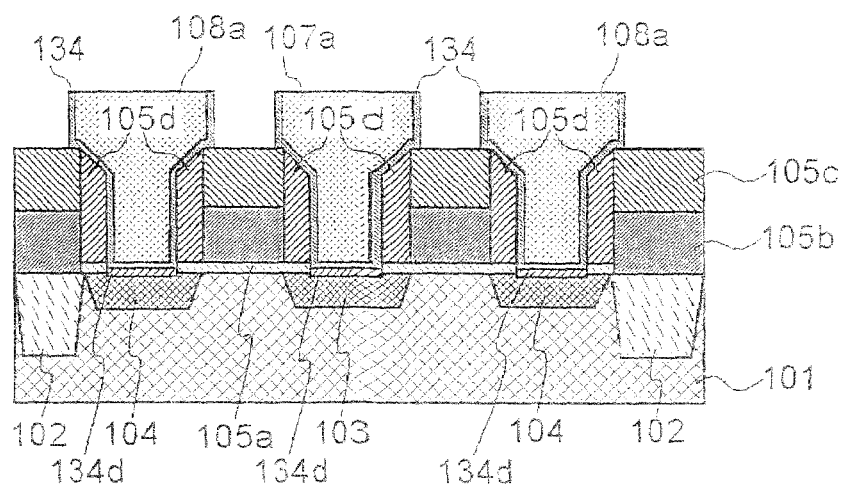

Then, as shown in FIG. 4G, organic coating film 132a with exposed surface areas was removed by isotropic etching with oxygen plasma to form columns of the contact plugs. The isotropic etching was carried out using non-biased ashing apparatus of plasma downflow type, under the conditions of 13.56 MHz, high-frequency power of 4500 W and pressure of 4 Torr (530 Pa). Ammonium plasma may be used for the isotropic etching. In this case, although a tungsten oxide film of 2 to 3 nm thick is formed on each surface area of the tungsten film, the tungsten oxide film can be reduced to a tungsten film by performing heat treatment for about five minutes at a temperature of 400° C. in a hydrogen atmosphere. Subsequently, the resultant was subjected to heat treatment at a temperature of 620° C. in a non-oxygenated atmosphere to have the silicon film and the titanium film in barrier layer 134 reacted with each other, for formation of titanium silicide film 134d. At this stage, since the organic coating film of low heat resistance has already been removed, high-temperature treatment may be available.

Figure 4H:
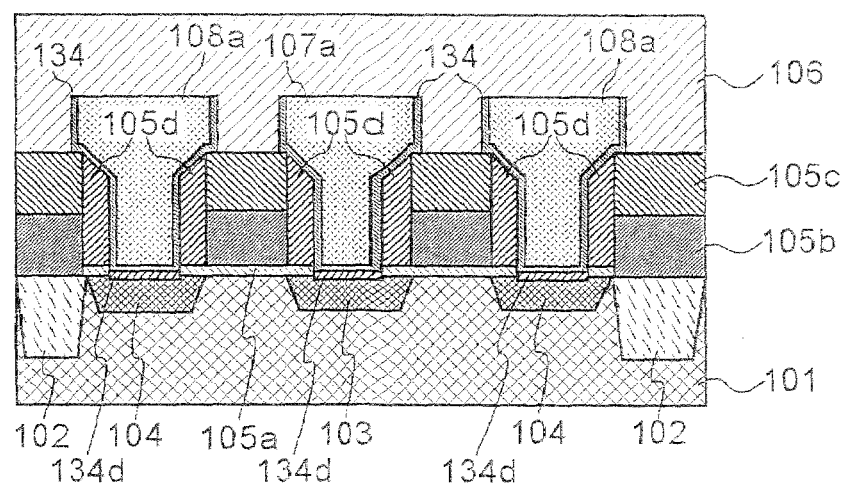

Then, as shown in FIG. 4H, first interlayer insulating film 106 made up of a silicon oxide film of 500 nm thick was formed overall using an HDP (High Density Plasma) process so as to cover the columns of the contact plugs. After that, a CMP (Chemical Mechanical Polishing) process was used to polish from the surface of the interlayer insulating film 106 to expose the surfaces of contact plugs 107a and 108a. Thus, a structure prior to the formation of second interlayer insulating film 109 shown in FIG. 2 was formed.

According to the present exemplary embodiment, the word lines of the DRAM are formed, followed by forming organic coating film 132a, which is further followed by anisotropic etching using ammonia plasma, to thereby form contact holes 107 and 108. Thus, since no fluorine or chlorine is contained in the etching atmosphere, the silicon oxide film or the silicon nitride film is substantially prevented from being etched. Accordingly, the problem of short circuiting of contact plugs 107a and 108a with gate electrode 105b can be prevented, which problem would otherwise have been caused by the etching of the sidewalls of each word line.

Further, formation of organic coating film 132a by spin coating may impart the film with significantly excellent planarity and may cause no voids in the film, comparing with a sacrificial film formed by a CVD process. This may allow omission of a step of performing a CMP process after formation of the film and a step of forming sidewall insulating films for burying voids exposed in the sidewalls after formation of contact holes 107 and 108, which steps have been essential for the CVD sacrificial film.

Considering the heat resistance of organic coating film 132a, the titanium film and the titanium nitride film constituting barrier layer 134 are formed by sputtering. Poor coverage of sputtering however may allow the titanium film and the titanium nitride film formed on the sidewalls of contact holes 107 and 108 to be thin, which may possibly let fluorine, the material forming tungsten, give damages to organic coating film 132a. However, organic coating film 132a in the present exemplary embodiment is completely covered with the low temperature formable silicon film which is formed as the lower layer of the titanium film, so that the influence of fluorine can be prevented.

Figure 6A:
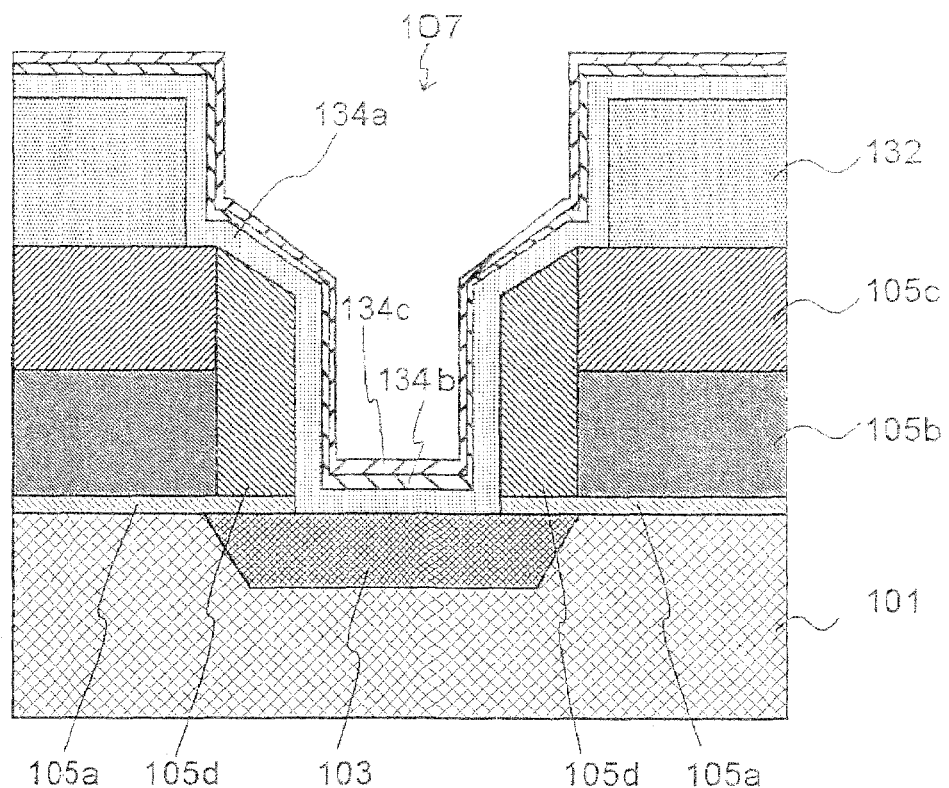
FIGS. 6A and 6B are cross-sectional views illustrating a series of steps, for supplementarily explaining a first exemplary embodiment of the present invention.
Figure 6B:
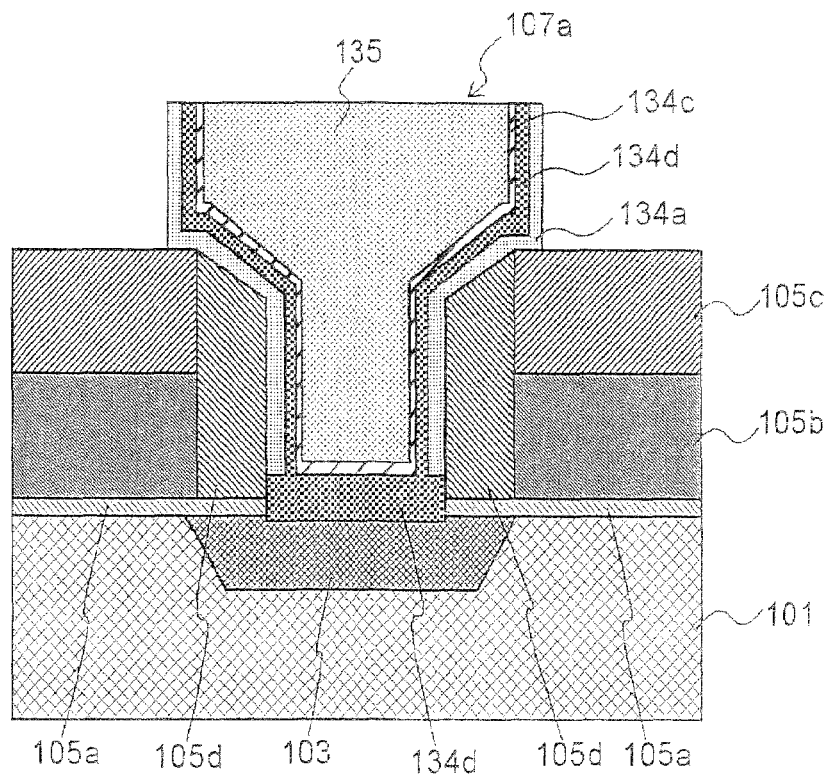

With reference to FIGS. 6A and 6B, further details of the method for forming barrier layer 134 used in the present exemplary embodiment will be described below. The method for forming barrier layer 134 will be described focusing on contact hole 107, but the same method is also applicable to contact hole 108.

Each of FIGS. 6A and 6B illustrates an enlarged view including one contact hole 107. As shown in FIG. 6A, contact hole 107 was formed in organic coating film 132a first, followed by forming silicon film 134a, titanium film 134b and titanium nitride film 134c. Silicon film 134a was formed as a boron-doped silicon film of 10 nm thick using disilane ($Si_2H_6$) and diborane ($B_2H_6$) as a material gas, with the use of a low-pressure CVD process at a temperature of 350° C. Titanium film 134b of 10 nm thick to be formed on silicon film 134a was formed by sputtering. Titanium nitride film 134c of 15 nm thick was successively formed by reactive sputtering using the same apparatus.

As shown in FIG. 6B, tungsten film 135 was buried to form contact plug 107a, followed by removing organic coating film 132a and performing heat treatment at a temperature of 620° C. to form titanium silicide film 134d. In the present exemplary embodiment, titanium film 134b is resultantly entirely turned to titanium silicide film 134d. Thus, the structure above diffusion layer 103 consists of titanium silicide film 134d, titanium nitride film 134c and tungsten film 135, while each of the sidewall portions has a structure consisting of silicon film 134a, titanium silicide film 134d, titanium nitride film 134c and tungsten film 135. It should be appreciated that silicon film 134a is formed of a p-type boron-doped silicon film. Accordingly, in the case where diffusion layer 103 is of an n-type, formation of the boron-doped silicon film may be followed by offsetting n-type impurities, such as phosphor or arsenic, by ion implantation.

As described above, barrier layer 134 is preferably formed using at least one material selected from a silicon film, first metal film, metal silicide film and metal nitride film made from fluorine-free material gas.

A titanium film or titanium nitride film formed by sputtering is generally poor in coverage, so that the film formed on the sidewalls of the contact hole becomes thin to deteriorate its barrier properties. However, in the present exemplary embodiment, silicon film 134a formed as the lowermost layer can serve as a barrier layer to prevent organic coating film 132a from being damaged, or etched, by fluorine which is produced when tungsten film 135 is formed. Silicon film 134a, which is amorphous and thus have no grain boundaries, is suitable for maintaining the barrier properties.

Further, in the present exemplary embodiment, titanium silicide film 134d can be formed on silicon film 134a formed by a CVD process, leading to an advantage of preventing junction breakage comparing with the case where a silicide film is directly formed on the surface of diffusion layer 103.

Second Exemplary Embodiment

As have been described in the BACKGROUND OF THE INVENTION, when forming contact holes in an interlayer insulating film made up of a silicon oxide film, the protection insulating film on the gate electrode and the side walls are each required to be formed of a silicon nitride film in which etching speed is lower than in a silicon oxide film, in order to ensure selectivity of dry etching. Silicon nitride films have inherently been suffering from a problem of increasing parasite capacitance in wiring because of the large dielectric constant. In addition, there is a concern that, when a silicon nitride film is located in the vicinity of a channel of a transistor, function of the silicon nitride film as a charge trap may be a cause of fluctuating threshold voltage of the transistor. In this regard, contact holes in the present invention are formed in an organic coating film which does not require selectivity in etching performed for the silicon oxide film or the silicon nitride film. Accordingly, the protection insulating film on the gate electrode and the sidewalls can each be formed of a silicon oxide film.

In the first exemplary embodiment, a silicon nitride film was used for protection insulating film 105c and sidewalls 105d of each of the word lines. In a second exemplary embodiment, referring to FIGS. 5A to 5C, a description is provided on an example of forming each of the protection insulating film and the sidewalls with a silicon oxide film.

Figure 5A:
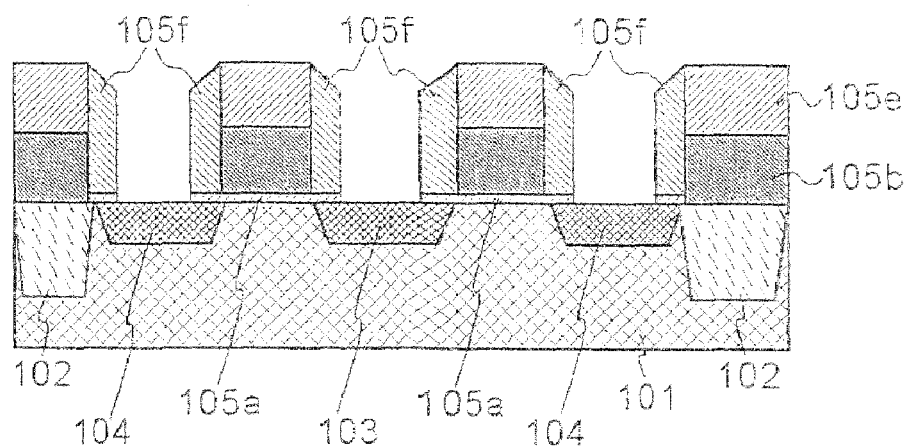
FIGS. 5A to 5C are cross-sectional views illustrating a series of steps, for explaining a second exemplary embodiment of the present invention.

As shown in FIG. 5A, gate insulating film 105*a* was formed first as in the first exemplary embodiment, followed by forming gate electrode 105*b* overall. After that, protection insulating film 105*e* made up of a silicon oxide film of 40 nm thick was formed overall by a plasma CVD process using monosilane and dinitrogen monoxide ($N_2O$) as a material gas. Then, protection insulating film 105*e* and gate electrode 105*b* were processed by lithography and dry etching to form word lines 105 shown in FIG. 1. Further, a silicon oxide film of 20 nm thick was formed overall using a CVD process, followed by etching back by dry etching to form sidewalls 105*f*. In this case, gate insulating film 105*a* is also etched to expose the surface areas of silicon substrate 101. As in the first exemplary embodiment, before forming sidewalls 105*f*, sidewalls of the metal material constituting the gate electrode may be covered with a silicon nitride film of about 10 nm thick. Covering the sidewalls in advance with the silicon nitride film can prevent the metal from being oxidized in an oxidizing atmosphere when forming the silicon oxide film.

Figure 5B:
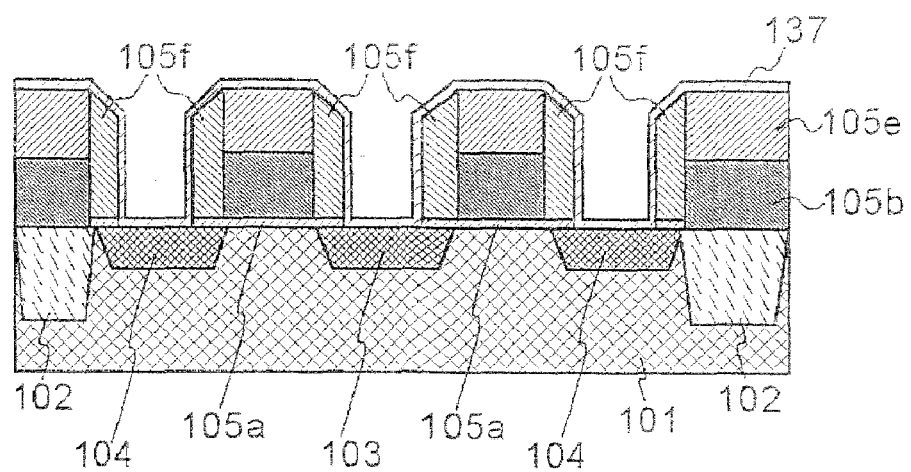

Then, as shown in FIG. 5B, silicon oxide film 137 of 10 nm thick was formed by a CVD process using monosilane and dinitrogen monoxide ($N_2O$) as a material gas.

Figure 5C:
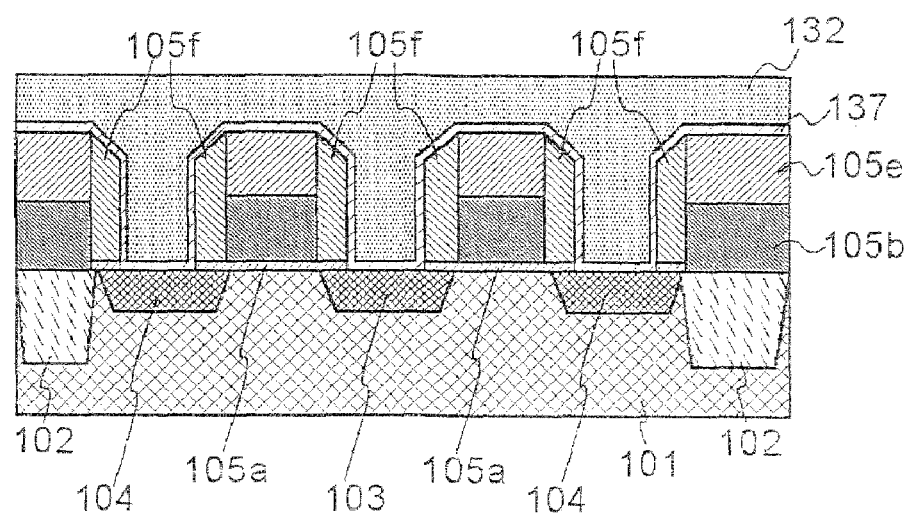

Then, as shown in FIG. 5C, organic coating film 132*a* was formed overall. Contact plugs 107*a* and 108*a* can be formed according to the steps of FIG. 4B onwards explained in the first exemplary embodiment.

It has been conventional to form an organic coating film on the surface of a silicon substrate and to subsequently form contact holes in the organic coating film to further form contact plugs. This however may cause conduction failure between the silicon substrate and the contact plugs. In this regard, according to the present exemplary embodiment, the exposed surface areas of silicon substrate 101 are once protected by silicon oxide film 137 at the stage of forming sidewalls 105*f* of silicon oxide, and then, organic coating film 132*a* is formed. Therefore, organic coating film 132*a* is not brought into contact with the silicon substrate to thereby avoid the problem of conduction failure mentioned above.

In addition, the present exemplary embodiments employ silicon oxide films for use as protection insulating film 105*e* and sidewalls 105*f*, rather than silicon nitride films for use as protection insulating film 105*c* and sidewalls 105*d*. Since the silicon oxide films have low dielectric constant and hardly function as charge traps, the problems of increase in the parasite capacitance in the wiring and fluctuation in the threshold voltages of the transistors, may advantageously be avoided.

Third Exemplary Embodiment

Referring now to cross-sectional views of FIGS. 4I to 4Q illustrating a series of steps, hereinafter is described a third exemplary embodiment taking an example, in which an organic coating film is used to form the capacitor contact plugs therein adjacent to the bit lines.

Figure 4I:
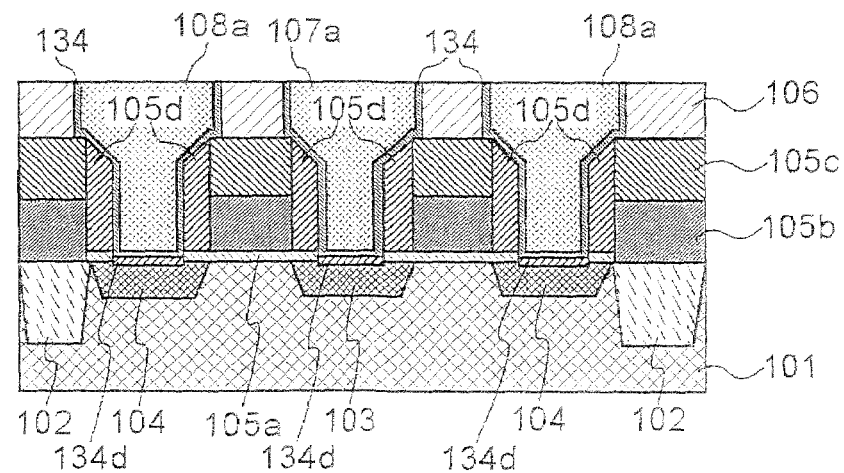
FIGS. 4I to 4Q are cross-sectional views illustrating a series of steps, for explaining a third exemplary embodiment of the present invention.

After forming first interlayer insulating film 106 made up of a silicon oxide film of 500 nm thick using an HDP process, as shown in FIG. 4H, the surfaces of contact plugs 107*a* and 108*a* were exposed, as shown in FIG. 4I, using a CMP process.

Figure 4J:
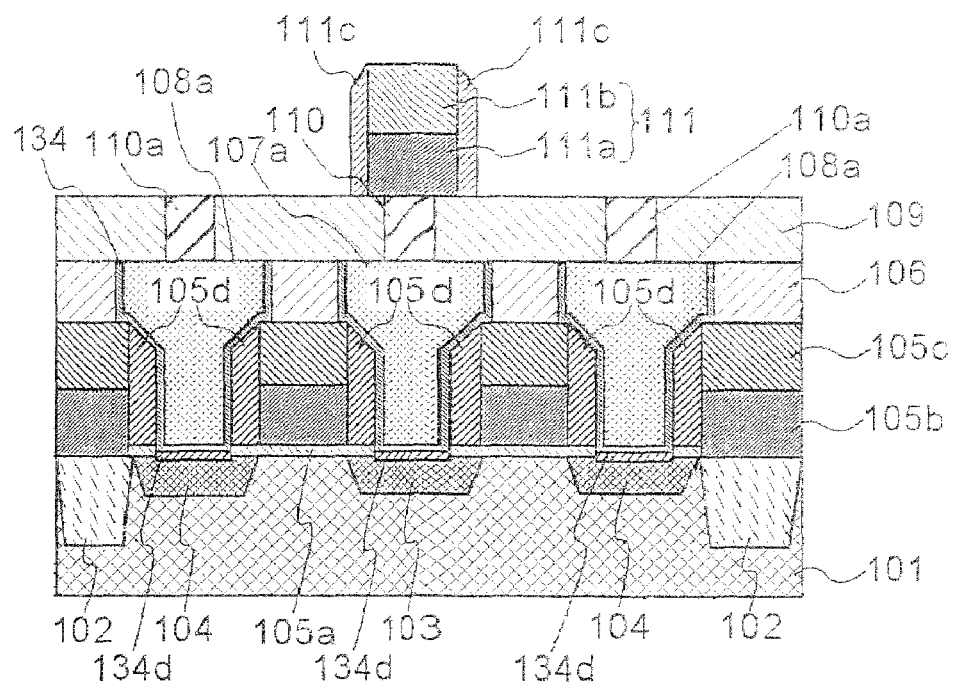

Then, as shown in FIG. 4J, second interlayer insulating film 109 made up of a silicon oxide film of 150 nm thick was formed, followed by forming second contact plugs 110*a* including bit-line contact plug 110 in each of predetermined regions in second interlayer insulating film 109. Second contact plugs 110 and 110*a* were formed by forming contact holes by lithography and dry etching and then by burying the contact holes with a titanium nitride film and tungsten film using a CVD process. Then, a tungsten nitride film of 10 nm thick and tungsten film 111*a* of 60 nm thick were stacked by sputtering, followed by depositing silicon oxide film 111*b* of 100 nm thick using a plasma CVD process. Subsequently, lithography and dry etching were performed to process silicon oxide film 111*b* and tungsten film 111*a* including the tungsten nitride film, whereby bit lines 111 were formed. Fluorine-containing plasma was used for etching the silicon oxide film and chlorine-containing plasma was used for etching the tungsten film.

Then, a silicon oxide film of 20 nm thick was formed overall, followed by etching back using dry etching to form sidewalls 111*c*. At this stage, tungsten film 111*a* constituting each bit line 111 is covered with the silicon oxide film at the top surface and lateral sides thereof. It should be appreciated that, prior to the formation of the silicon oxide films, a silicon nitride film as thin as about 5 nm may be formed in advance. Formation of the silicon nitride film in advance may effectively suppress oxidization of the tungsten film.

Figure 4K:
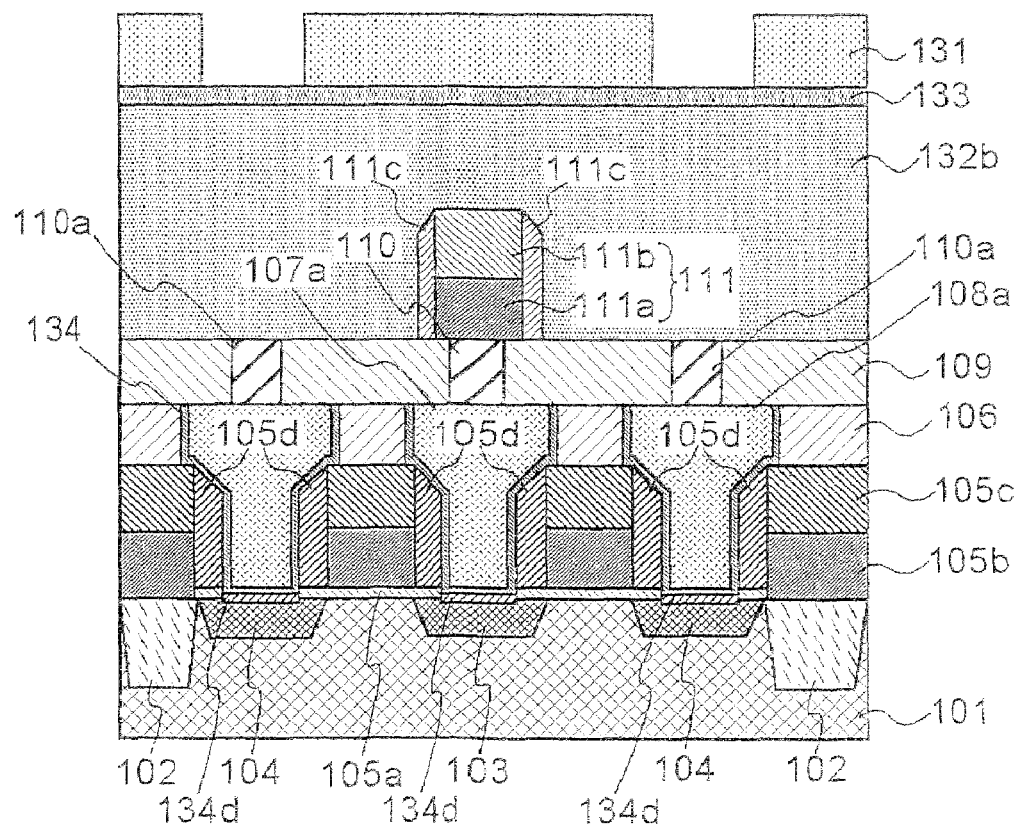

Then, as shown in FIG. 4K, organic coating film 132*b* of 400 nm thick was formed overall by spin coating. As organic coating film 132*b*, one without containing silicon was used. The coating was followed by baking at a temperature of 425° C. Subsequently, hard mask layer 133 consisting of a silicon oxide film of 15 nm thick was formed overall using a CVD method. Further, a hole pattern consisting of photoresist 131 was formed by lithography.

Figure 4L:
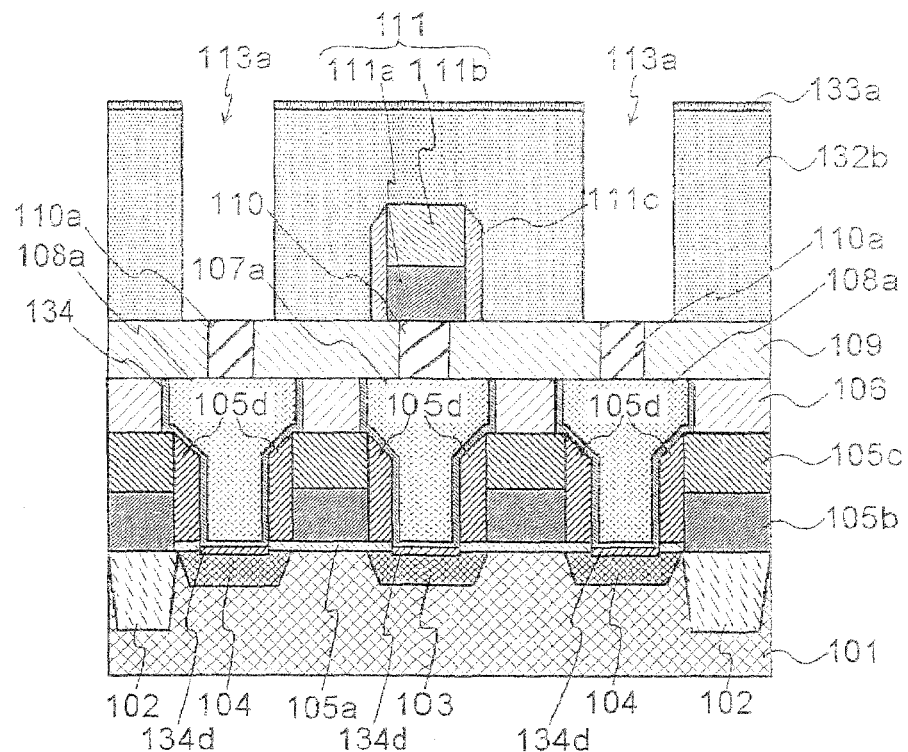

Then, as shown in FIG. 4L, hard mask layer 133 was etched with gas plasma of tetrafluorocarbon ($CF_4$) by using photoresist 131 as a mask to form hard mask 133*a*. Further, organic coating film 132*b* was subjected to anisotropic dry etching with ammonia plasma by using hard mask 133*a* and photoresist 131 as a mask to form contact holes 113*a*. For the etching of organic coating film 132*b*, a plasma etching apparatus of parallel plate electrodes type was used under the conditions of 13.56 MHz, high-frequency power of 1000 W and pressure of 100 mTorr. Use of plasma without containing fluorine or chlorine in this etching can ensure etching selection ratio for the silicon oxide film by a factor of 100 or more. Accordingly, the silicon oxide film remains without being substantially etched. In this case, photoresist 131 is also etched concurrently.

Figure 4M:
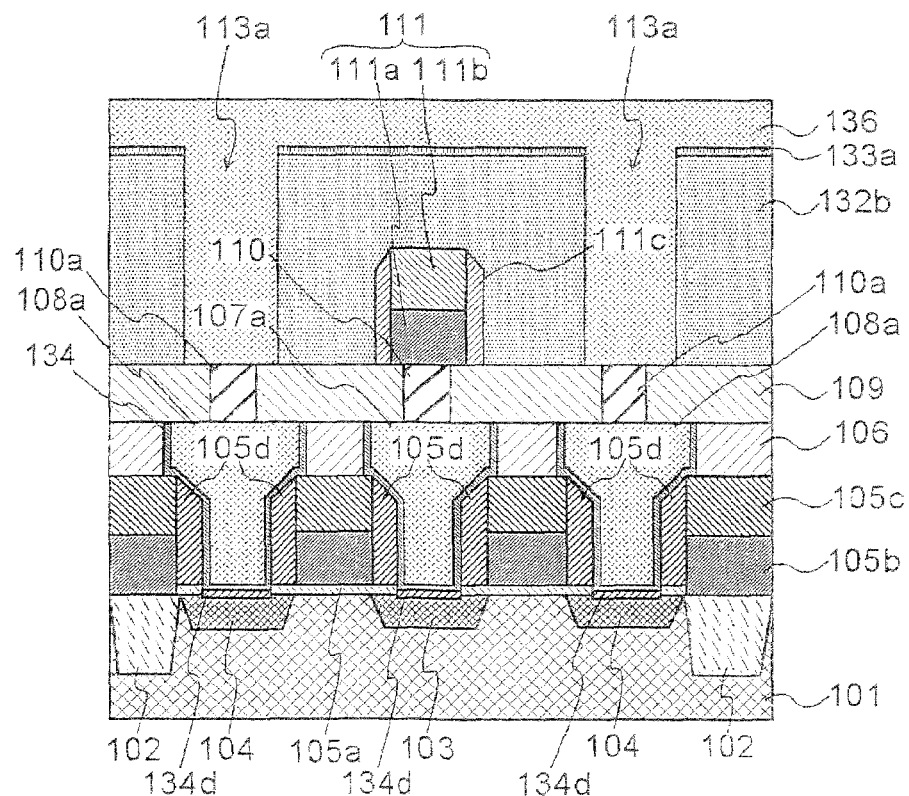

Then, as shown in FIG. 4M, a titanium nitride film (not shown) of 10 nm thick and tungsten film 136 of 50 nm thick were stacked and formed overall using a CVD process. Thus, capacitor contact holes 113*a* were buried by tungsten film 136. In the present exemplary embodiment, since second contact plugs 110*a* located below are formed of a tungsten film, there is no need of forming a titanium film for forming silicide. Thus, the apparatus used for the processes does not have to have a capability of successively forming a titanium film and a titanium nitride film, leading to possible use of an apparatus for forming titanium nitride films to form a titanium nitride film alone with good coverage. The titanium nitride film here was formed at a temperature of 380° C. using an ALD (Atomic Layer Deposition) process. Generally used CVD processes using titanium tetrachloride ($TiCl_4$) and ammonia ($NH^3$) as a material gas, require temperature of 550° C. or more, which may possibly cause heat deformation of organic coating film 132*b*. However, use of an ALD process for alternately and repeatedly forming films in the order of atomic layers, may enable formation of films at a temperature of 400° C. or less to thereby prevent heat deformation of organic coating film 132*b*. The thickness of the film was set at 10 nm. Tungsten film 136 was formed at a temperature of 400° C. by a CVD process using tungsten hexafluoride (WF$_6$) and hydrogen as a material gas. In this case, although fluorine is produced with the decomposition of WF$_6$, organic coating film 132b, which is covered with the titanium nitride film of good coverage, will not be etched by the fluorine. As in the first exemplary embodiment, the method may be applicable, in which a silicon film of good coverage is formed using a CVD process, followed by successively forming a titanium film and a titanium nitride film by sputtering and then by forming a tungsten film using a CVD process. In this case, the silicon film functions as a barrier layer for preventing the influence of fluorine.

Figure 4N:
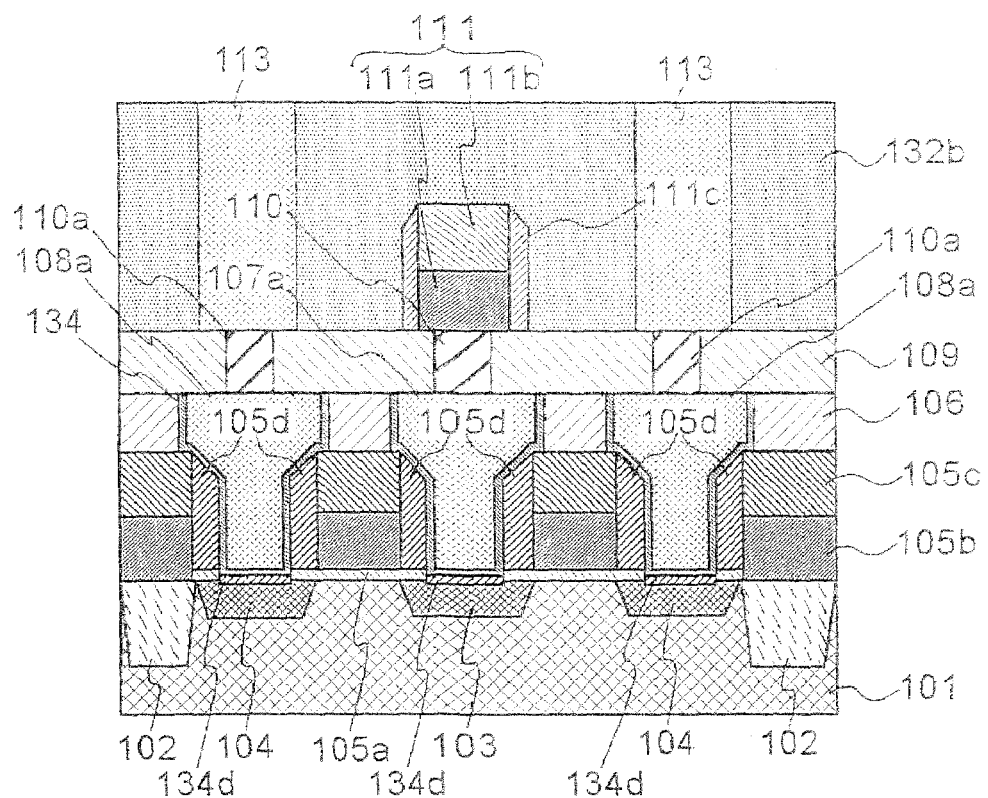

Then, as shown in FIG. 4N, tungsten film 136 and hard mask 133a on organic coating film 132b were removed using a CMP process. Thus, capacitor contact plugs 113 were formed by tungsten film 136 remained in capacitor contact holes 113a to concurrently expose surface areas of organic coating film 132b.

Figure 4O:
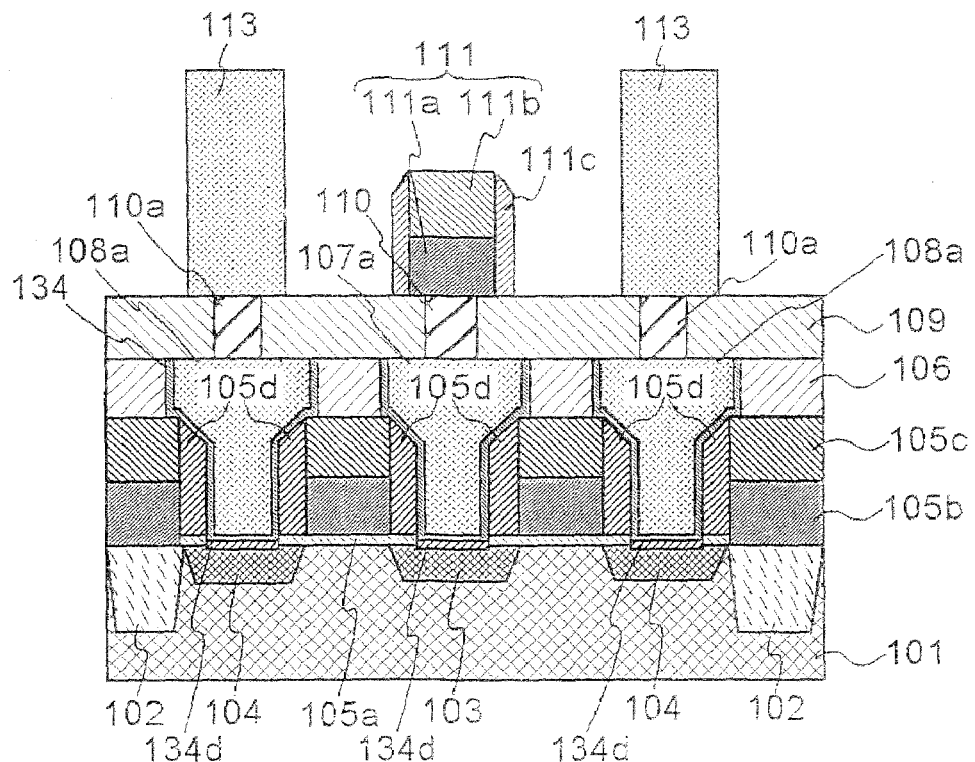

Then, as shown in FIG. 4O, organic coating film 132b with the exposed surface areas was selectively removed by isotropic etching using oxygen plasma. The isotropic etching was carried out using non-biased ashing apparatus of plasma downflow type, under the conditions of 13.56 MHz, high-frequency power of 4500 W and pressure of 4 Torr. In this case, a tungsten oxide film of 2 to 3 nm thick is formed on each surface area of tungsten film 136 which constitutes each capacitor contact plug 113. This tungsten oxide film however can be turned to a tungsten film by having it reduced with heat treatment at a temperature of 400° C. for about five minutes in a hydrogen atmosphere.

Figure 4P:
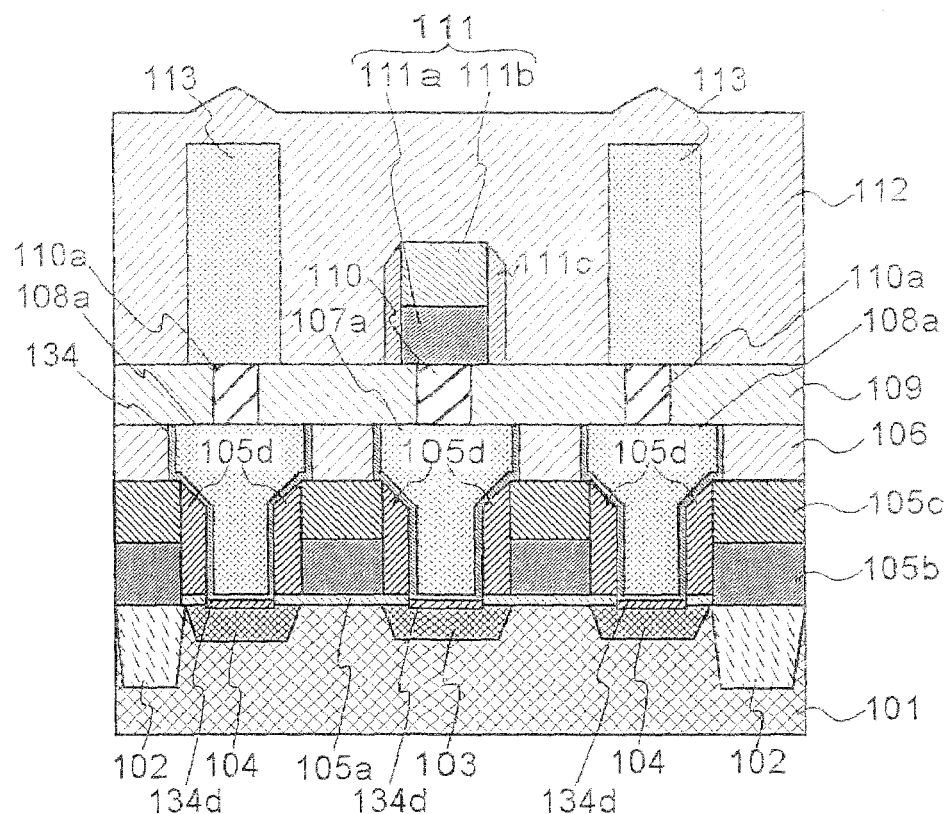

Then, as shown in FIG. 4P, third interlayer insulating film 112 made up of a silicon oxide film of 500 nm thick was formed so as to cover all capacitor contact plugs 113 by performing an HDP (High Density Plasma)-CVD process using monosilane and oxygen as a material gas.

Figure 4Q:
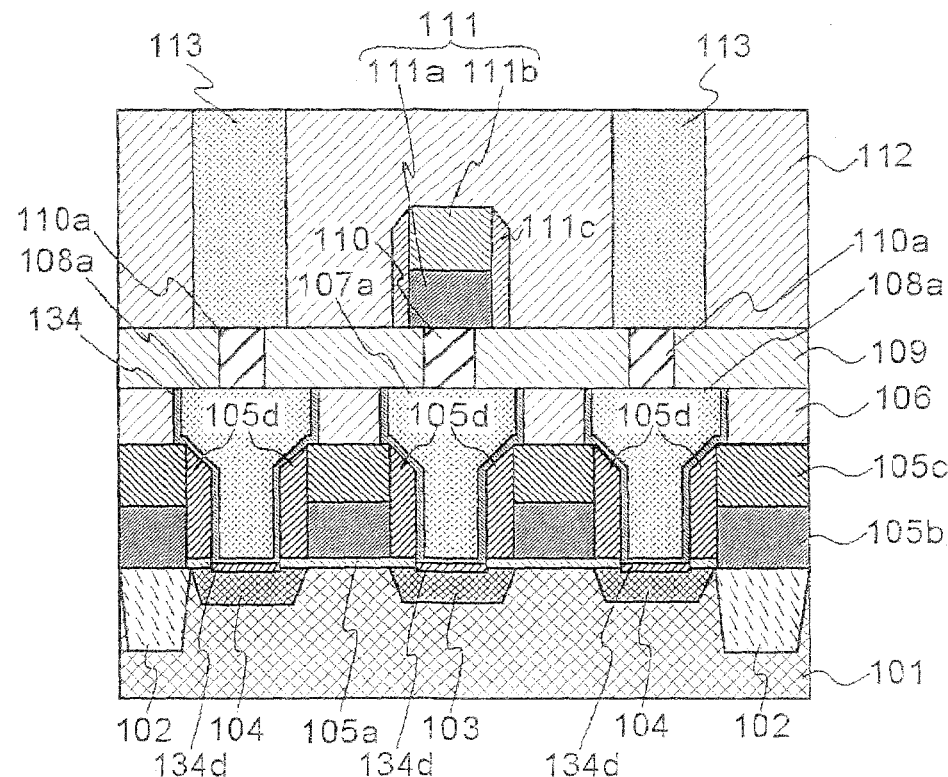

Then, as shown in FIG. 4Q, the surface of third interlayer insulating film 112 was polished using a CMP process to expose surface areas of capacitor contact plugs 113. From this step onwards, fourth interlayer insulating film 114, cylinder holes, capacitor lower electrodes 115, capacitor insulating film 116 and upper electrodes 117, fifth interlayer insulating film 118, and wiring layer 119 may be formed, as shown in FIG. 2, to manufacture a semiconductor device constituting a DRAM.

According to the present exemplary embodiment, a sacrificial interlayer film made up of organic coating film 132b is formed in the state where second interlayer insulating film 109 is formed on contact plugs 108a, and each of bit lines 111 formed on second interlayer insulating film 109 is covered, at its top surface and lateral sides, with silicon oxide films 111b and 111c, respectively. Since organic coating film 132b can be dry etched using a gas, such as oxygen, hydrogen or ammonia, without containing halogen gas, capacitor contact holes 113a can be formed in organic coating film 132b with no etching being performed for silicon oxide films 111b and 111c covering each of bit lines 111. Accordingly, silicon oxide films 111b and 111c of sufficient thickness can be left on each of bit lines 111, advantageously preventing the occurrence of short circuiting between capacitor contact plugs 113 and bit lines 111. In addition, after forming capacitor contact plugs 113, organic coating film 132b alone can be removed using oxygen plasma or the like, without disadvantageously influencing other parts of the structure. Since this can be followed by formation of third interlayer insulating film 112 made up of a silicon oxide film to cover capacitor contact plugs 113, the subsequent capacitor-forming steps can advantageously be performed using conventional techniques. In DRAMs, it is preferred that parasite capacitance of the bit lines is reduced as much as possible because such parasite capacitance can considerably influence the operations of the memory. In the present exemplary embodiment, each of the bit lines is covered with the silicon oxide films each having lower dielectric constant than a silicon nitride film to provide an advantage of reducing the parasite capacitance.

While the invention has been particularly shown and described with reference to exemplary embodiments thereof, the invention is not limited to these exemplary embodiments. It will be understood by those of ordinary skill in the art that various changes in form and details may be made therein without departing from the spirit and scope of the present invention as defined by the claims.

What is claimed is:

1. A method for manufacturing a semiconductor device, which at least comprises in the following order:
   (1) forming an organic coating film on a semiconductor substrate;
   (2) forming contact holes in the organic coating film;
   (3) forming a contact plug in each of the contact holes;
   (4) selectively removing the organic coating film so as to expose at least a portion of sidewalls of each of the contact plugs;
   (5) forming an inorganic insulating film overall so as to bury the contact plugs in the inorganic insulating film; and
   (6) polishing a surface of the inorganic insulating film thereby to expose surfaces of the contact plugs.

2. The method according to claim 1, wherein the organic coating film is an organic coating film without containing silicon.

3. The method according to claim 1, wherein forming the organic coating film is preceded by forming steps of wiring lines on the semiconductor substrate.

4. The method according to claim 3, wherein the wiring lines are word lines for a dynamic random access memory.

5. The method according to claim 3, wherein the wiring lines are bit lines for a dynamic random access memory.

6. The method according to claim 1, wherein the contact plugs are connected to the semiconductor substrate or respective conductive plugs located under the contact plugs.

7. The method according to claim 6, wherein each of the contact plugs is formed of a lower-layer barrier layer and an upper-layer metal film.

8. The method according to claim 7, wherein the barrier layer is formed of a material selected from a silicon film, a metal film, a metal silicide film and a metal nitride film.

9. The method according to claim 7, wherein after forming contact holes in the organic coating film, forming the contact plugs at least comprises in the following order:
   (1) forming a silicon film overall;
   (2) forming a first metal film and a metal nitride film overall after forming the silicon film;
   (3) forming a second metal film overall so as to bury the contact holes after forming the first metal film and the metal nitride film;
   (4) removing the silicon film, the first metal film and the metal nitride film, and the second metal film formed on the organic coating film so as to expose surface areas of the organic coating film;
   (5) selectively removing the organic coating film with exposed surface areas; and
   (6) forming a metal silicide film by having the silicon film reacted with the first metal film by heat treatment.

10. A method for manufacturing a semiconductor device, which at least comprises in the following order:
 (1) forming a plurality of word lines on a semiconductor substrate and forming an organic coating film overall by using a spin coating process so as to cover the word lines;
 (2) forming a hard mask layer on the organic coating film;
 (3) forming a hole pattern of photoresist on the hard mask layer;
 (4) transferring the hole pattern to the hard mask layer to form a hard mask;
 (5) dry etching the organic coating film with ammonia or oxygen plasma using at least the hard mask as a mask so as to form contact holes on the semiconductor substrate;
 (6) forming a barrier layer overall so as to cover inner surfaces of the contact holes, the barrier layer being made up of a silicon film, a first metal film and a metal nitride film;
 (7) forming a second metal film overall so as to bury the insides of the contact holes;
 (8) forming contact plugs by removing the barrier layer and the second metal film formed on a surface of the organic coating film, while concurrently exposing surface areas of the organic coating film;
 (9) removing the organic coating film with exposed surface areas by dry etching with ammonia or oxygen plasma to form columns of the contact plugs;
 (10) forming an inorganic insulating film overall so as to cover the columns of the contact plugs; and
 (11) polishing the inorganic insulating film from above a surface thereof to thereby expose surfaces of the contact plugs.

11. The method according to claim 10, wherein the method further comprises giving heat treatment later, after step (9) to have the silicon film reacted with the first metal film, so that a metal silicide film is formed at least between the metal nitride film and the semiconductor substrate.

* * * * *